(12) United States Patent
Giesen et al.

(10) Patent No.: US 9,637,379 B2
(45) Date of Patent: May 2, 2017

(54) METHOD FOR PRODUCING A MICROELECTROMECHANICAL TRANSDUCER

(71) Applicant: EPCOS AG, München (DE)

(72) Inventors: Marcel Giesen, München (DE); Thomas Metzger, München (DE); Phillip Ekkels, München (DE); Ansgar Schäufele, München (DE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/909,105

(22) PCT Filed: Jul. 2, 2014

(86) PCT No.: PCT/EP2014/064099
§ 371 (c)(1),
(2) Date: Jan. 30, 2016

(87) PCT Pub. No.: WO2015/018571
PCT Pub. Date: Feb. 12, 2015

(65) Prior Publication Data
US 2016/0167960 A1    Jun. 16, 2016

(30) Foreign Application Priority Data

Aug. 6, 2013 (DE) .................. 10 2013 108 464

(51) Int. Cl.
*B81C 1/00* (2006.01)
*G01L 9/00* (2006.01)
(Continued)

(52) U.S. Cl.
CPC ...... *B81C 1/00682* (2013.01); *B81C 1/00666* (2013.01); *B81C 99/004* (2013.01);
(Continued)

(58) Field of Classification Search
None
See application file for complete search history.

(56) References Cited

U.S. PATENT DOCUMENTS

| 4,872,945 A | 10/1989 | Myers et al. |
| 6,622,368 B1 | 9/2003 | Müllenborn et al. |

(Continued)

FOREIGN PATENT DOCUMENTS

| DE | 69926757 T2 | 6/2006 |
| EP | 1093703 B1 | 8/2005 |

(Continued)

*Primary Examiner* — Asok K Sarkar
(74) *Attorney, Agent, or Firm* — Slater Matsil, LLP

(57) ABSTRACT

A method can be used for producing a microelectromechanical transducer. A plurality of microelectromechanical transducers are produced on a single wafer. Each transducer includes a diaphragm. The wafer is divided into at least a first and a second region. The mechanical tensions of a random sample of diaphragms of the first region are established and the values are compared with a predetermined desired value. The mechanical tensions of a random sample of diaphragms of the second region are established and the values are compared with the predetermined desired value. The tensions of the diaphragms in the first region are adjusted to the predetermined desired value, and the tensions of the diaphragms in the second region are adjusted to the predetermined desired value.

18 Claims, 2 Drawing Sheets

(51) Int. Cl.
*H04R 31/00* (2006.01)
*B81C 99/00* (2010.01)

(52) U.S. Cl.
CPC .......... *G01L 9/0073* (2013.01); *H04R 31/003* (2013.01); *B81B 2201/0257* (2013.01); *B81B 2201/0264* (2013.01); *B81B 2203/0127* (2013.01)

(56) References Cited

U.S. PATENT DOCUMENTS

| | | | |
|---|---|---|---|
| 8,012,360 B1 * | 9/2011 | Sippola | G01L 9/0042 216/13 |
| 2005/0233492 A1 | 10/2005 | Ouellet et al. | |
| 2007/0066027 A1 | 3/2007 | Lin et al. | |
| 2008/0075306 A1 | 3/2008 | Poulsen et al. | |

FOREIGN PATENT DOCUMENTS

| | | |
|---|---|---|
| WO | 9965277 A1 | 12/1999 |
| WO | 2007036422 A1 | 4/2007 |

* cited by examiner

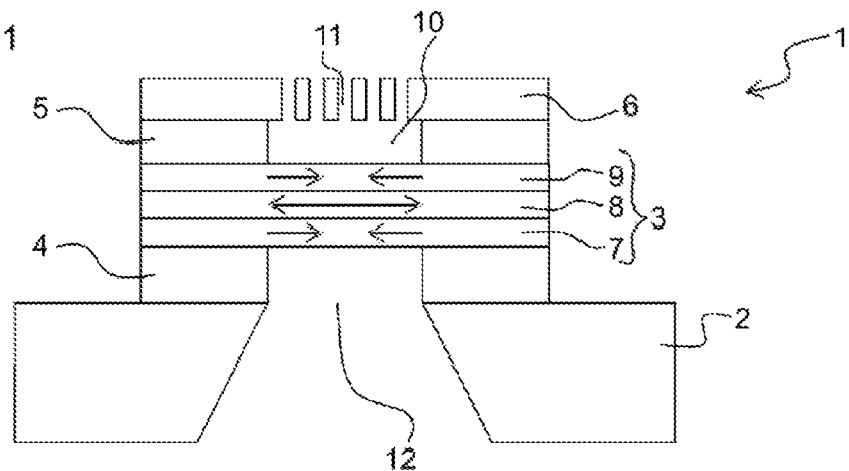
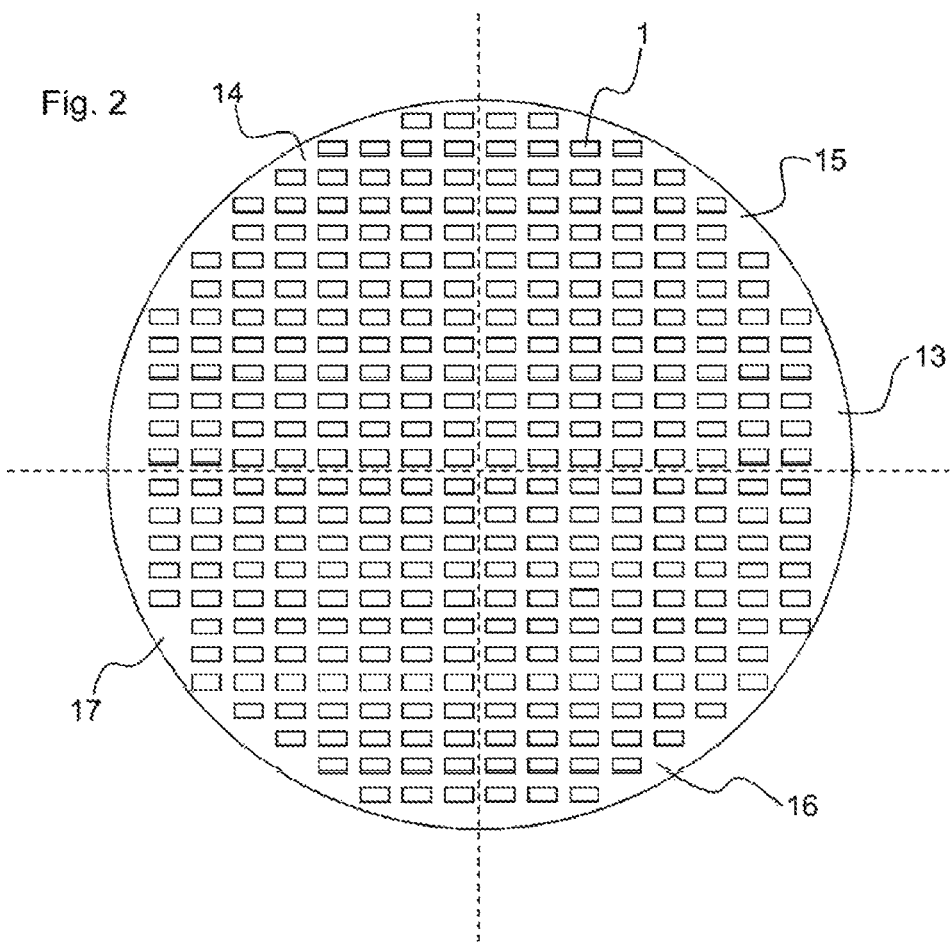

METHOD FOR PRODUCING A MICROELECTROMECHANICAL TRANSDUCER

This patent application is a national phase filing under section 371 of PCT/EP2014/064099, filed Jul. 2, 2014, which claims the priority of German patent application 10 2013 108 464.8, filed Aug. 6, 2013, each of which is incorporated herein by reference in its entirety.

TECHNICAL FIELD

The present invention relates to a method for producing a microelectromechanical transducer. The transducer comprises a diaphragm.

BACKGROUND

The transducer can by way of example convert mechanical signals that are generated by virtue of the diaphragm deflecting into electrical signals. The electrical signals can be generated by way of example by virtue of a change in a capacitance between the diaphragm and a non-moveable backplate, wherein a voltage is applied between the diaphragm and the backplate. The mechanical signals that deflect the diaphragm can be generated by way of example by means of sound waves or other fluctuations in pressure. Accordingly, the transducer can be used as a microphone and measure the sound waves. The transducer can also be used as a pressure sensor.

A method for producing such a microelectromechanical transducer is known from EP 1 093 703 B1. In the case of the method that is described in EP 1 093 703 B1, the tension of all the diaphragms is adjusted retrospectively in a common method step for a batch that comprises a plurality of wafers, wherein each wafer comprises in turn a transducer having a diaphragm.

However, in the case of this method, each diaphragm of the batch is always treated in an identical manner. It is accordingly not possible to compensate for differences between the individual diaphragms of a wafer, said differences can occur during the production process. Consequently, when the predetermined limits for the tensions of the diaphragms that are to be produced are very narrow, the method results in a significant part of the diaphragms remaining outside these limits and leads to the fact that it is moreover not possible to retrospectively adjust these diaphragms individually to a satisfactory extent. Accordingly, the number of rejects is significant.

A Gaussian-curve-like distribution of the tensions of the diaphragms typically occurs during the production of a wafer. The method in accordance with EP 1 093 703 B1 renders it possible to displace the mean value of this distribution. However, it does not render it possible to change the shape of the distribution. When the predetermined specification limits are narrow, a significant part of the transducer produced will comprise a diaphragm whose tension lies outside the predetermined specification limits even after the method has been implemented.

SUMMARY

Embodiments of the invention provide a method for producing a microelectromechanical transducer that is characterized by improved efficiency, by way of example by virtue of the fact that the diaphragms can be adjusted in an improved manner to the predetermined specifications.

A method is proposed for producing a microelectromechanical transducer that comprises the following steps. A plurality of microelectromechanical transducers are produced on a single wafer, wherein each transducer comprises a diaphragm. The wafer is divided into at least a first and a second region. The mechanical tensions of a random sample of diaphragms of the first region are established and the values are compared with a predetermined desired value. The mechanical tensions of a random sample of diaphragms of the second region are established and the values are compared with the predetermined desired value. The mechanical tension of the diaphragms in the first region are adjusted to the predetermined desired value, and the mechanical tension of the diaphragms in the second region are adjusted to the predetermined desired value.

The steps can be performed in the sequence described herein.

Moreover, the method is suitable for producing a plurality of microelectromechanical transducers. Microelectromechanical transducers that have already been produced are further processed using the method. In particular, the mechanical tensions of the diaphragms are adjusted to suit the microelectromechanical transducers.

The method thus treats each of the wafers individually, wherein moreover each wafer is divided into at least two regions in which in turn the mechanical tensions of the diaphragms are adjusted independently of the respective other region. It is possible in this manner to correct any local deviations in the tensions of the diaphragms in the one region from the respective other region.

In contrast to the known method, this method accordingly also renders it possible in addition to displacing the above mentioned distribution of the tensions of the diaphragms in a wafer to change the shape of the distribution. In particular, the distribution can be reduced in size so that a greater proportion of the diaphragms is now within the predetermined specification limits. It is possible in this manner to considerably reduce the number of the rejects produced.

The microelectromechanical transducers can comprise in addition to the diaphragm a mating electrode that can be embodied by way of example by means of a backplate. The transducer can be suitable for the purpose of applying an electrical voltage between the diaphragm and the mating electrode so that the diaphragm and mating electrode form a capacitor. If changes in the capacitance of the capacitor are measured, then the transducer can be used as a microphone or as a pressure sensor.

The wafer comprises a plurality of transducers. The term "plurality" describes in this case at least two transducers, wherein the wafer will however comprise in a typical manner clearly more than two transducers.

The wafer is divided into at least two regions. Each of the regions comprises at least one transducer having a diaphragm. However, the regions can clearly also comprise more than one transducer. The wafer can be divided into any desired large number of regions, wherein each of the regions comprise at least one transducer having a diaphragm.

The wafers can be divided into regions by way of example on the basis of empirical values that indicate that the scatter of the target parameter "mechanical tension" is identical in the specific zones of the wafer. The wafer can be divided in such a manner that in each case one region matches in each case one of the zones from which it is assumed that the mechanical tensions of the diaphragms are almost equal in this zone. It is thus possible to assume that a deviation of the mechanical tension of one diaphragm from the predetermined desired value at one transducer in the respect region is representative for the deviations in the entire region.

It is thus possible to divide the wafer into regions on the basis of assumed differences between the mechanical tensions of the diaphragms in the regions.

In a further method step, the mechanical tensions of a random sample of diaphragms of the respective region is established for each region separately from the other regions and the values are compared with the predetermined desired value. The respective mechanical tensions can be established by virtue of taking measurements. By way of example, the capacitance of a diaphragm can be measured using a measuring tip in dependence upon an applied electrical voltage and it is subsequently possible to calculate the mechanical tension of the diaphragm from this information.

Further alternative methods for determining the mechanical tension of the diaphragm 3 are known from EP1 093 703 B1. These methods can be used in this case as an alternative or in addition to the above described measuring procedure using the measuring tip.

The predetermined desired value can also describe a range of acceptable mechanical tensions.

The random sample can correspond to a percentage of diaphragms of the respective region. By way of example, the random sample can comprise between 0.1 and 100% of the diaphragms of the respective region, it is preferred that the random sample comprises between 1 and 10% of the diaphragms of the respective region. The size of the random sample can be determined in dependence upon the desired level of accuracy and upon the anticipated deviation from a predetermined desired value for the tensions of said diaphragms.

The random sample can also comprise a specific number of diaphragms of the respective region. The random sample can comprise a single diaphragm of the respective region. The random sample can comprise all diaphragms of the respective region.

It is possible to determine a mean value for the tensions of the diaphragms of the random sample of the respective region and the tensions of the diaphragms of the region can be subsequently adjusted so that the mean value matches the predetermined desired value. It is possible in this manner to adjust as many as possible diaphragms so that their tension lies within the predetermined specifications limits.

In a further method step, the mechanical tensions of the diaphragms in the first region are adjusted. It is possible to use for this purpose different methods in which the loading and/or the thickness of the diaphragms in the first region can be adjusted. The loading of the diaphragm is also described as the "tension" of the diaphragm. All diaphragms of the first region can be treated in the identical manner in this method step.

The mechanical tensions of the diaphragms in the second region are subsequently adjusted. It is possible to use a different method for adjusting the mechanical tensions of the diaphragms in the second region than in the first region. In turn, the mechanical tension of the diaphragms can be achieved by virtue of adjusting the thickness and/or the loading of the diaphragms. Each diaphragm in the second region can be treated in an identical manner in this method step.

If the transducer has been divided into more than two regions, it is possible in a further method step to adjust the mechanical tensions of the diaphragms in the other regions successively and in each case independently of the other regions.

The adjustment of the mechanical tension can represent rendering the value of the mechanical tensions of the diaphragms in the respective region closer to a desired value. A mean value of the random sample of the respective region can be set to the predetermined desired value.

The steps of establishing and adjusting the mechanical tension of the diaphragm are performed in the respective region separately from establishing and adjusting the mechanical tensions of the diaphragms in the other regions.

When adjusting the mechanical tensions of the diaphragms in the respective region, the tension of the diaphragms in the respective other region can remain unchanged. This renders it possible in particular to treat each region independently from the respective other regions and thus to compensate for any differences between the regions that arise during the production process.

If it is possible to anticipate any differences that could occur during the production process, then the wafer can be divided into the regions on the basis of these assumptions.

When determining the mechanical tension of a diaphragm, the capacitance of the respective transducer can be measured in dependence upon an applied electrical voltage and the tension of the diaphragm ascertained therefrom. In particular, the capacitance can be measured using a measuring tip that is placed against the diaphragm, wherein the change in capacitance is taken into consideration by virtue of positioning the measuring tip.

Moreover, the method can include the step of adjusting the mechanical tensions of the diaphragms of all regions in a common method step, wherein this step is performed prior to the wafer being divided into at least a first and a second region. The mechanical tensions of the diaphragms can be subsequently adjusted for the first and the second region as described above in each case independently of the diaphragms of the respective other region. It is thus possible initially to perform a rough correction for all diaphragms of the wafer and then to perform a fine correction of the mechanical tensions of the diaphragms in each region in a localized manner. The rough correction that is performed first renders it possible to accelerate the method and to perform it in a more efficient manner.

When adjusting the mechanical tensions of the diaphragms in the respective region, the thickness of all diaphragms in the respective region can be adjusted in a common method step. The mechanical tension of a diaphragm is derived as the product of the thickness and loading of the diaphragm. Accordingly, the tension is proportional to the thickness of the diaphragm.

The thickness of the diaphragms can be reduced in the respective region by virtue of the localized etching of the region. The localized etching can be performed by means of a plasma etching method or by means of a chemical etching method during the gas, vapor or liquid phase. In particular, the localized etching procedure can be a halogen-based method.

The thickness of the diaphragms can be increased in the respective region by means of localized deposition of material in this region. The locally deposited material can comprise silicon nitride. The locally deposited material can be identical to the material of the diaphragm or the material of an outer layer of the diaphragm. It is possible in this manner to avoid loadings on the diaphragm as a result of different coefficients of thermal expansion that would in turn change the mechanical tension of the diaphragm.

When adjusting the mechanical tensions of the diaphragms in the respective region, the tension can be adjusted by implanting in the diaphragm at least either foreign atoms or foreign ions or foreign molecules. The implanted foreign atoms or ions or molecules influence the loading of the diaphragm and in this manner also the tension of the diaphragm. It is possible in this manner to increase or reduce the mechanical tension of the diaphragm irrespective of which foreign atoms, ions or molecules are implanted.

Each transducer can comprise a spacer having a substance that has a glass transition temperature and a substrate, wherein each of the diaphragms is fastened to the spacer and is spaced apart from the substrate. The method can include the step of heating the transducer to a temperature above the glass transition temperature of the substance. As a consequence, any loading of the diaphragm as a result of the type of construction can be reduced. The transducer can subsequently be cooled to a temperature that is below the glass transition temperature.

The method can include the step of separating the wafer into transducers that are separate from one another, wherein this step is performed after the tension of the diaphragms in the respective regions has been adjusted.

BRIEF DESCRIPTION OF THE DRAWINGS

The invention is further explained hereinunder with reference to exemplary examples in the associated figures. The figures illustrate different exemplary embodiments of the invention with reference to schematic illustrations that are not true to scale.

FIG. 1 illustrates a schematic view of a microelectromechanical transducer.

FIG. 2 illustrates a schematic view of a wafer.

DETAILED DESCRIPTION OF ILLUSTRATIVE EMBODIMENTS

Figure 3:
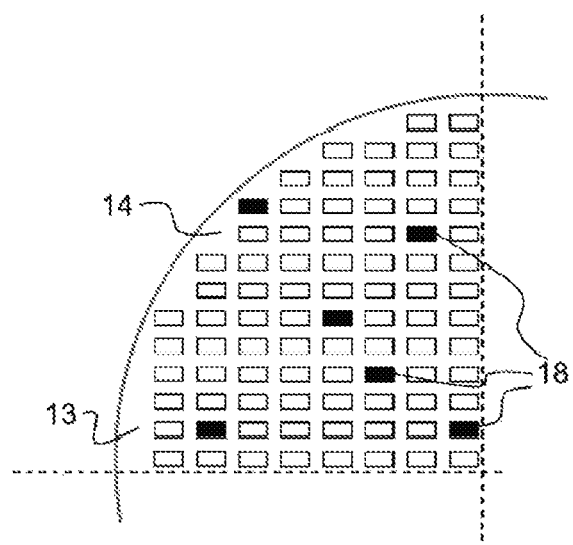
FIG. 3 illustrates schematically the selection of a random sample in a region of the wafer.

FIG. 1 illustrates a schematic view of a microelectromechanical transducer 1 that can be used in particular as a microphone. The transducer 1 comprises a substrate 2, a diaphragm (or membrane) 3 and a first spacer 4. The edges of the diaphragm 3 are fastened to the first spacer 4. The diaphragm 3 is spaced apart from the substrate 2. A second spacer 5 is arranged on the face of the diaphragm 3 that is remote from the substrate 2. A backplate 6 is fastened to the second spacer 5. An electrical voltage is applied between the backplate 6 and the diaphragm 3.

The diaphragm 3 comprises three layers 7, 8, 9. In particular, the diaphragm 3 comprises two outer layers 7, 9 and an inner layer 8 that is arranged between the two outer layers 7, 9. The inner layer 8 comprises a poly-crystalline silicon. The two outer layers 7, 9 comprise silicon nitride. The substrate 2 comprises silicon and the backplate 6 comprises poly-crystalline silicon. The spacers 4, 5 consist in each case of an insulating material, by way of example silicon oxide ($SiO_2$).

The diaphragm 3 is thin and has a low mechanical tension so that it can move about a position of equilibrium. The term "tension" of the diaphragm 3 describes in this case a mechanical tension which is different to the electrical voltage that can be applied between the diaphragm 3 and the backplate 6. Fluctuations in pressure that are triggered by way of example by sound waves lead to the diaphragm 3 deflecting from its position of equilibrium. In particular, the distance between the diaphragm 3 and the backplate 6 can change.

The second spacer 5 creates an air gap 10 between the diaphragm 3 and the backplate 6. The backplate 6 comprises at least one opening 11 through which sound waves penetrate into the air gap 10 and thus can pass to the diaphragm 3. Moreover, a rear volume 12 is arranged on the opposite-lying face of the diaphragm 3, said rear volume being formed by means of an opening in the substrate 2.

The diaphragm 3 and backplate 6 are each electrically conductive. If an electrical voltage is applied between the diaphragm 3 and the backplate 6, the two components thus form a capacitor, the capacitance of which can be changed by virtue of deflecting the diaphragm 3. If sound waves pass through the opening 11 in the backplate 6, then they reach the diaphragm 3 and deflect the diaphragm 3. The capacitance of the capacitor consequently changes. This change in capacitance can be measured so that the transducer 1 can be used as a pressure sensor or a microphone.

The inner layer 8 of the diaphragm comprises polycrystalline silicon that has been doped with boron or phosphorus and moreover comprises a compressive stress as indicated in FIG. 1 by the arrow. The two outer layers 7, 9 of the diaphragm 3 comprise in each case a tensile stress as is likewise indicated by arrows. The total mechanical tension of the diaphragm 3 is derived as the sum of the tensions of the individual layers 7, 8, 9. The loading of the layer 7, 8, 9 is determined in each layer 7, 8, 9 essentially by means of two factors. On the one hand, a loading as a result of the type of construction contributes to the loading of the layer 7, 8, 9, wherein the loading as a result of the type of construction occurs by virtue of applying the layer 7, 8, 9. On the other hand, a thermal loading contributes to the mechanical tension of the layers 7, 8, 9, wherein the thermal loading occurs as a result of the different coefficients of thermal expansion of the different materials.

The loading as a result of the type of construction can be considerably reduced by means of the following method step. The material of the spacer 4, 5 is a silicon oxide and accordingly has a glass transition temperature. In the event of the glass transition temperature being exceeded, the material changes from a solid glass into a rubber-like melt up to a viscous melt.

If the transducer 1 or a wafer with a plurality of transducers 1 is heated to a temperature above the glass transition temperature of the spacer 4, 5, the material of the spacer 4, 5 thus becomes viscous and loses its rigidity. Accordingly, the tension of the diaphragm 3 is reduced. The transducer 1 or rather the wafer that comprises a plurality of transducers 1 subsequently cools, wherein the material of the spacers 4, 5 in turn becomes rigid. The loading of the diaphragm 3 as a result the type of construction is however considerably reduced so that the diaphragm 3 essentially experiences only a thermal loading that arises from the different coefficients of thermal expansion of the layers of the diaphragm 3.

A method is explained hereinunder that renders it possible to produce a wafer with a plurality of transducers 1 and to subsequently adjust the mechanical tensions of the diaphragms 3 of the transducers 1 individually or at least in localized groups.

FIG. 2 illustrates a schematic view of a wafer 13. The wafer 13 comprises a plurality of transducers 1. Each of the transducers 1 is a transducer 1 that is illustrated in FIG. 1 and comprises in each case a diaphragm 3.

The object of the method described in this case is to adjust the mechanical tensions of the diaphragms 3 of the transducers 1 on the wafer 13 to a predetermined specification, in particular a predetermined desired value. The mechanical tension of a diaphragm 3 is derived as the product of the thickness of the diaphragm 3 and the loading of the diaphragm 3.

The wafer 13 is divided during a first method step into a first region 14, a second region 15, a third region 16 and a fourth region 17. This represents an exemplary division for a first exemplary embodiment of the method. The wafer 13 can be divided in alternative embodiments of the method into any number of regions, wherein the number of the regions is always greater than or equal to two and the pattern of the division can be selected so as to be different. It is possible to divide the wafer 13 into the individual regions 14, 15, 16, 17 by way of example in accordance with a distribution of the mechanical tensions, said distribution being dictated by the production process.

In a further method step, a random sample 18 of transducers 1 is selected from each of the regions, as is illustrated in FIG. 3 for the first region 14. The size of the random sample 18 is selected depending upon the different parameters. These parameters include by way of example the desired level of accuracy and the anticipated size of the deviation of the tensions of the diaphragms 3 from the desired value.

The tension of the diaphragm 3 of each transducer 1 of the random sample 18 is determined in a further step. The ascertained tensions of the diaphragm 3 of the random sample 18 from the respective regions 14, 15, 16, 17 are subsequently averaged and in a further method the tensions of all diaphragms 3 in the respective region 14, 15, 16, 17 are adjusted in dependence upon the previously ascertained mean value of the random sample 18 of this region 14, 15, 16, 17. It is possible in this manner to treat each region 14, 15, 16, 17 of the wafer 13 independently from the other regions 14, 15, 16, 17 of the wafer 13. It is possible in this manner to subsequently correct localized deviations in one region from another region during the process of producing the wafer 13. This would not be possible in particular if all diaphragms 3 of the wafer 13 were always treated collectively.

The tension of a diaphragm 3 can be determined in different ways. An exemplary method for this is explained hereinunder. A measuring tip is placed against the diaphragm 3. An electrical voltage is applied between the diaphragm 3 and the backplate 6 so that the diaphragm 3 and the backplate 6 form a capacitor.

The measuring tip ascertains the capacitance. The voltage is now increased in steps. The measuring tip measures the change in the capacitance between the diaphragm 3 and the backplate 6. The applied electrical voltage continues to be increased up to the so-called collapse. The diaphragm 3 touches the backplate 6 and the applied voltage is suddenly reduced. It is possible to calculate the tension of the diaphragm 3 on the basis of the capacitance value at which this collapse occurs.

Moreover, it is taken into consideration the fact that the measuring tip falsifies the mechanical tension of the diaphragm 3 in that said measuring tip exerts a mechanical pressure on the diaphragm 3. However, the influence of this effect can be minimized. For this purpose, the measuring tip is always pressed with the same amount of force against the diaphragm 3. In addition, the dimensions of the wafer 13 are measured prior to it being contacted by the measuring tip. In so doing, any deformations of the wafer 13 or fluctuations in the height of the wafer 13 can be detected. This information can be taken into consideration during the procedure of positioning the measuring tip and the position of the measuring tip is adjusted accordingly so that deformations of the wafer 13 and fluctuations in the height of the wafer 13 cannot falsify the results when measuring the capacitance using the measuring tip.

The measured value of the capacitance in dependence upon the applied electrical voltage is additionally subsequently corrected taking into account the value of the force that the measuring tip exerts on the diaphragm 3.

Further alternative methods for determining the mechanical tension of the diaphragm 3 are known from EP1 093 703 B1. These methods can be used as an alternative or in addition to the above described measuring procedure using the measuring tip.

If the mean value of the mechanical tensions of the diaphragms 3 is determined in the respective region 14, 15, 16, 17, the tensions of diaphragms 3 in the respective region 14, 15, 16, 17 will be approaching the desired value. For this purpose, each region 14, 15, 16, 17 is treated individually. Accordingly, in particular when adjusting the tensions of the diaphragms 3 in the first region 14, the tensions of the diaphragms 3 in the other regions 15, 16, 17 are not changed and conversely.

When adjusting the tensions of the diaphragms 3 in a region 14, 15, 16, 17 to the desired value, the tension of the diaphragms 3 can be both increased and also reduced. The tensions are increased if the mean value for this region 14, 15, 16, 17 is less than the predetermined desired value. Similarly, the tensions are reduced if the mean value for the respective region 14, 15, 16, 17 is greater than the predetermined desired value.

Different methods for increasing or reducing the tensions of the diaphragms 3 are explained hereinunder.

If the mean value of the random sample is greater than the predetermined desired value, then the tensions of the diaphragms 3 can be reduced by virtue of the fact that material is etched away from the diaphragm 3 so that the thickness of the diaphragm 3 is reduced. It is possible to use for this purpose a plasma etching method or a chemical etching method using an etching medium in the gas, vapor or liquid phase. The etching method can be in particular a halogen-based method.

In the case of the etching method, a corresponding tool that performs the etching procedure is guided along over the wafer 13. However, it is also sufficient to move the target location or focus of the etching procedure. A corresponding thickness of the material of the diaphragm 3 is etched away depending upon the dwell period of the tool over the respective region 14, 15, 16, 17. Accordingly, the etching tool can be used for a longer period of time in the regions 14, 15, 16, 17, in which a comparatively large deviation of the mean value of the random sample 18 has been established, than in those regions in which the mean value deviates by a lesser amount. It is possible in this manner to readjust the thicknesses of the diaphragms 3 differently to one another in different regions 14, 15, 16, 17 of the wafer 13.

If the mean value of the random sample 18 is less than the predetermined desired value, then the mechanical tensions of the diaphragms 3 can be increased by virtue of the fact that material is applied to the diaphragm 3 so that the thickness of the diaphragm 3 is increased.

For this purpose, material is deposited on one of the outer layers 7, 9 of the diaphragm 3. The deposited material can be in particular a silicon nitride that is identical to the material of the outer layer 7, 9. It is possible in this manner to avoid any further thermal loadings occurring as a result of different thermal coefficients of expansion.

The material can be applied to the respective regions 14, 15, 16, 17 of the wafer 13 using a similar tool as described above. The tool applies different amounts of material depending upon its dwell period in the respective region 14, 15, 16, 17. Thus, one region of the wafer 13 can be treated differently to another region. The tool can moreover be suitable for the purpose of performing an etching procedure in the one region of the wafer 13 and thus to reduce the thickness of the diaphragms 3 in this region and to deposit material in another region of the wafer 13 and thus increase the thickness of the diaphragms 3 in this other region. It is crucial when so doing that the tool is suitable for treating each region 14, 15, 16, 17 independently of the respective adjacent other regions 14, 15, 16, 17.

If the thicknesses of the diaphragms 3 change, then as a result the relationship of the region in which a tensile stress is prevailing also changes with respect to the regions of the diaphragm 3 in which a compressive stress is prevailing. As a consequence, the tension of the diaphragm 3 can also be adjusted.

As an alternative or in addition to changing the thickness of the diaphragms 3, it is also possible to adjust the loading of the diaphragms 3 retrospectively. This can be achieved by implanting in the diaphragm 3 either foreign atoms or foreign ions or foreign molecules. These influence the loadings of the respective diaphragm 3 and thus render it possible to reduce the loading and consequently to increase or reduce the tension of the diaphragm 3 in a purposeful manner.

The above described tool can also be used for the implanting procedure which renders it possible to treat different regions 14, 15, 16, 17 of the wafer 13 separately from one another. Accordingly, it is possible by way of example to implant more foreign atoms or foreign ions or foreign molecules in one region than in another.

A further improvement of the method is possible by virtue of the fact that initially a rough correction is performed for all regions 14, 15, 16, 17 of the wafer 13. The transducers 1 are treated collectively in all regions 14, 15, 16, 17 of the wafer 13. It is only then that the wafer 13 is divided into different regions 14, 15, 16, 17 and for each region 14, 15, 16, 17 subsequently, as described above, a fine correction is performed on the tensions of the diaphragms 3. In this manner, the method can be embodied so as to be overall more efficient and consequently more cost-effective since it is possible in certain circumstances in this manner to considerably reduce the time required for finely adjusting each individual region 14, 15, 16, 17.

Once the mechanical tensions of the diaphragms 3 in each of the regions 14, 15, 16, 17 have been adjusted, the wafer 13 is separated into individual transducers 1. It can by way of example be sawn up for this purpose.

The invention claimed is:

1. A method for producing a microelectromechanical transducer, the method comprising:
producing a plurality of microelectromechanical transducers on a single wafer, wherein each transducer comprises a diaphragm;
dividing the wafer into a first region and a second region;
establishing mechanical tensions of a random sample of diaphragms of the first region;
comparing values of the established mechanical tensions of the random sample of diaphragms of the first region with a predetermined desired value;
establishing mechanical tensions of a random sample of diaphragms of the second region;
comparing values of the established mechanical tensions of the random sample of diaphragms of the second region with the predetermined desired value;
adjusting the mechanical tensions of the diaphragms in the first region to the predetermined desired value; and
adjusting the mechanical tensions of the diaphragms in the second region to the predetermined desired value.

2. The method according to claim 1, wherein, when adjusting the mechanical tensions of the diaphragms in the first region, the mechanical tensions of the diaphragms in the second region remain unchanged.

3. The method according to claim 1, wherein establishing mechanical tensions of a random sample of diaphragms of the first region comprises measuring a capacitance of the respective transducer in dependence upon an applied electrical voltage and ascertaining the mechanical tension of the diaphragm from the measured capacitance.

4. The method according to claim 3, wherein measuring the capacitance comprises using a measuring tip that is placed against the diaphragm and wherein a change in the capacitance is taken into consideration when positioning the measuring tip.

5. The method according to claim 1, further comprising adjusting the mechanical tensions of the diaphragms of the first and second regions in a common method step that is performed prior to dividing the wafer into a first and a second region.

6. The method according to claim 1, wherein adjusting the mechanical tensions of the diaphragms in the first region comprises adjusting thicknesses of all diaphragms in the first region in a common method step.

7. The method according to claim 6, wherein adjusting the thicknesses of the diaphragms in the first region comprises performing localized etching of the first region.

8. The method according to claim 7, wherein the localized etching is performed by a plasma etching method or by a chemical etching method in a gas, vapor or liquid phase.

9. The method according to claim 7, wherein the localized etching comprises a halogen-based method.

10. The method according to claim 6, wherein adjusting the thicknesses of the diaphragms in the first region comprises increasing the thicknesses by performing a localized deposition of material in the first region.

11. The method according to claim 10, wherein performing the localized deposition comprises performing a localized deposition of silicon nitride.

12. The method according to claim 1, wherein adjusting the mechanical tension of the diaphragms in the first region comprises implanting foreign atoms, foreign ions, or foreign molecules in the diaphragm.

13. The method according to claim 1, wherein each transducer comprises a spacer comprising a substance that has a glass transition temperature and a substrate;
wherein each of the diaphragms is fastened to the spacer and spaced apart from the substrate; and
wherein the method comprises heating the transducer to a temperature above the glass transition temperature of the substance.

14. The method according to claim 1, further comprising separating the wafer into transducers that are separate from one another, wherein the wafer is separated after the mechanical tensions of the diaphragms have been adjusted.

15. A method for producing a plurality of microelectromechanical transducers, the method comprising:
producing a plurality of microelectromechanical transducers on a single wafer, wherein each transducer comprises a diaphragm;
dividing the wafer into a first region, a second region, a third region and a fourth region, each region including about one quarter of the wafer;

establishing mechanical tensions of a random sample of diaphragms of the first region;
comparing values of the established mechanical tensions of the random sample of diaphragms of the first region with a predetermined desired value;
establishing mechanical tensions of a random sample of diaphragms of the second region;
comparing values of the established mechanical tensions of the random sample of diaphragms of the second region with the predetermined desired value;
establishing mechanical tensions of a random sample of diaphragms of the third region;
comparing values of the established mechanical tensions of the random sample of diaphragms of the third region with a predetermined desired value;
establishing mechanical tensions of a random sample of diaphragms of the fourth region;
comparing values of the established mechanical tensions of the random sample of diaphragms of the fourth region with a predetermined desired value;
adjusting the mechanical tensions of the diaphragms in the first region to the predetermined desired value;
adjusting the mechanical tensions of the diaphragms in the second region to the predetermined desired value;
adjusting the mechanical tensions of the diaphragms in the third region to the predetermined desired value;
adjusting the mechanical tensions of the diaphragms in the fourth region to the predetermined desired value; and
separating the wafer into transducers that are separate from one another, wherein the wafer is separated after the mechanical tensions of the diaphragms of the first, second, third and fourth regions have been adjusted.

16. The method according to claim 15, wherein, when adjusting the mechanical tensions of the diaphragms in one of the regions, the mechanical tensions of the diaphragms in the other regions remain unchanged.

17. The method according to claim 15, wherein adjusting the mechanical tensions of the diaphragms in the first region comprises adjusting thicknesses of all diaphragms in the first region in a common method step;
wherein adjusting the mechanical tensions of the diaphragms in the second region comprises adjusting thicknesses of all diaphragms in the second region in a common method step;
wherein adjusting the mechanical tensions of the diaphragms in the third region comprises adjusting thicknesses of all diaphragms in the third region in a common method step; and
wherein adjusting the mechanical tensions of the diaphragms in the fourth region comprises adjusting thicknesses of all diaphragms in the fourth region in a common method step.

18. The method according to claim 15, wherein adjusting the mechanical tension of the diaphragms in the first region comprises implanting foreign atoms, foreign ions, or foreign molecules in the diaphragm.

* * * * *